United States Patent
Chang et al.

(10) Patent No.: US 10,545,376 B2
(45) Date of Patent: Jan. 28, 2020

(54) LIGHT SOURCE DEVICE AND DISPLAY DEVICE

(71) Applicant: InnoLux Corporation, Miao-Li County (TW)

(72) Inventors: Chun-Kai Chang, Miao-Li County (TW); Cheng-Yuan Hsiao, Miao-Li County (TW); Shih-Fu Liao, Miao-Li County (TW); Ping-Hsun Tsai, Miao-Li County (TW); I-An Yao, Miao-Li County (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 0 days.

(21) Appl. No.: 16/124,705

(22) Filed: Sep. 7, 2018

(65) Prior Publication Data

US 2019/0094623 A1 Mar. 28, 2019

(30) Foreign Application Priority Data

Sep. 27, 2017 (CN) .......................... 2017 1 0892624

(51) Int. Cl.
| | |
|---|---|
| G02F 1/1335 | (2006.01) |
| H01L 25/075 | (2006.01) |
| H01L 33/50 | (2010.01) |
| H01L 27/12 | (2006.01) |
| H01L 25/04 | (2014.01) |

(52) U.S. Cl.
CPC .. *G02F 1/133611* (2013.01); *G02F 1/133603* (2013.01); *G02F 1/133606* (2013.01); *H01L 25/0753* (2013.01); *H01L 27/1214* (2013.01); *H01L 33/505* (2013.01); *H01L 25/048* (2013.01); *H01L 2933/0091* (2013.01)

(58) Field of Classification Search
CPC ......... G02F 1/133611; G02F 1/133606; G02F 1/133603; H01L 27/1214; H01L 33/505; H01L 25/0753; H01L 25/048; H01L 2933/0091

See application file for complete search history.

(56) References Cited

U.S. PATENT DOCUMENTS

| | | | | |
|---|---|---|---|---|
| 2002/0180351 | A1* | 12/2002 | McNulty | B82Y 20/00 313/512 |
| 2006/0278886 | A1* | 12/2006 | Tomoda | H01L 33/20 257/99 |
| 2012/0218318 | A1* | 8/2012 | Hirao | H01L 24/34 345/690 |

(Continued)

*Primary Examiner* — Donald L Raleigh
(74) *Attorney, Agent, or Firm* — Muncy, Geissler, Olds & Lowe, P.C.

(57) ABSTRACT

A light source device includes a substrate and a plurality of light-emitting units disposed on a surface of the substrate. At least one of the light-emitting units includes a light source chip and an optical material layer covering the light source chip. A maximum width is defined as a distance between two farthest points on a pattern corresponding to a vertical projection of the optical material layer on the surface of the substrate, and a half of the maximum width is defined as a first width R. A maximum height H is defined as a vertical distance from the surface of the substrate to a highest point of the optical material layer away from the substrate. A ratio of R to H is between 5 and 1000. A display device applying the light source device is also provided.

20 Claims, 7 Drawing Sheets

(56) References Cited

U.S. PATENT DOCUMENTS

| | | | |
|---|---|---|---|
| 2014/0319560 A1* | 10/2014 | Tischler | H01L 33/502 |
| | | | 257/98 |
| 2014/0367633 A1* | 12/2014 | Bibl | G02F 1/133603 |
| | | | 257/13 |
| 2016/0293806 A1* | 10/2016 | Lee | H01L 33/502 |
| 2018/0261582 A1* | 9/2018 | Henry | H01L 27/1214 |
| 2019/0027659 A1* | 1/2019 | Yamada | H01L 33/54 |
| 2019/0074417 A1* | 3/2019 | Andrews | H01L 24/48 |

* cited by examiner

LIGHT SOURCE DEVICE AND DISPLAY DEVICE

CROSS REFERENCE TO RELATED APPLICATIONS

This Non-provisional application claims priority under 35 U.S.C. § 119(a) on Patent Application No(s). 201710892624.2 filed in People's Republic of China on Sep. 27, 2017, the entire contents of which are hereby incorporated by reference.

BACKGROUND

Technical Field

The disclosure relates to a light source device and a display device with the light source device.

Related Art

In the market, the liquid crystal display devices are mostly the backlight type liquid crystal display devices. Generally, the backlight type liquid crystal display device includes a liquid crystal panel and a backlight module. The backlight module is one of the critical components of the liquid crystal display device, and it includes light-emitting units for providing sufficient illumination and uniform light so that the liquid crystal panel can display images. According to the positions of the light-emitting units, the backlight module can be divided into an edge-type backlight module and a direct-type backlight module.

The direct-type backlight module has been widely used in the large-size display panel. As the development of display device technology, the demand for the thin display device increases. Thus, the backlight module needs to be thinner. However, the thinner backlight module may have insufficient light mixing, which will cause the poor uniformity of the outputted light. In order to solve this problem, the existing solution is to increase the density of the light-emitting units. However, this solution will increase the manufacturing cost. Accordingly, it is desired to reduce the density of the light-emitting units and to achieve a high uniformity of outputted light.

SUMMARY

In view of the foregoing, a light source device in a backlight module that can solve the above problem is provided.

A light source device comprises a substrate and a plurality of light-emitting units disposed on a surface of the substrate. At least one of the light-emitting units comprises a light source chip and an optical material layer covering the light source chip. A maximum width is defined as a distance between two farthest points on a pattern corresponding to a vertical projection of the optical material layer on the surface of the substrate. A half of the maximum width is defined as a first width R. A maximum height H is defined as a vertical distance from the surface of the substrate to a highest point of the optical material layer away from the substrate. A ratio of R to H is between 5 and 1000.

A display device includes a light source device, and the light source device includes a substrate and a plurality of light-emitting units disposed on a surface of the substrate. At least one of the light-emitting units includes a light source chip and an optical material layer covering the light source chip. A maximum width is defined as a distance between two farthest points on a pattern corresponding to a vertical projection of the optical material layer on the surface of the substrate. A half of the maximum width is defined as a first width R. A maximum height H is defined as a vertical distance from the surface of the substrate to a highest point of the optical material layer away from the substrate. A ratio of R to H is between 5 and 1000.

In some embodiments of the disclosure, the shape of the optical material layer of the light source device is adjusted and designed, and the ratio of R to H is controlled between 5 and 1000. This configuration can modify the light shape of the light emitted from the light-emitting units so as to obtain a more uniform outputted light from the light source device.

BRIEF DESCRIPTION OF THE DRAWINGS

The embodiments will become more fully understood from the detailed description and accompanying drawings, which are given for illustration only, and thus are not limitative of the present disclosure, and wherein.

DETAILED DESCRIPTION OF THE DISCLOSURE

The embodiments of the disclosure will be apparent from the following detailed description, which proceeds with reference to the accompanying drawings, wherein the same references relate to the same elements.

First Embodiment

Figure 1:
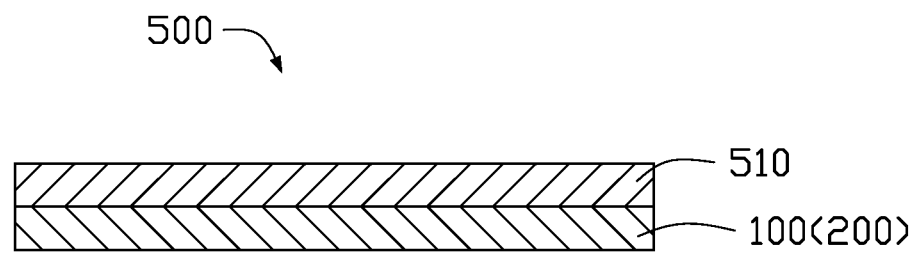
FIG. 1 is a sectional view of a display device according to an embodiment of the disclosure.

Referring to FIG. 1, a display device 500 of this embodiment includes a light source device 100 and a display panel 510 stacked on the light source device 100. The light source device 100 provides a light source to the display panel 510. In this embodiment, the display panel 510 is a liquid crystal panel, and the light source device 100 is a backlight module. Accordingly, the display device 500 is a liquid crystal display device.

Figure 2:
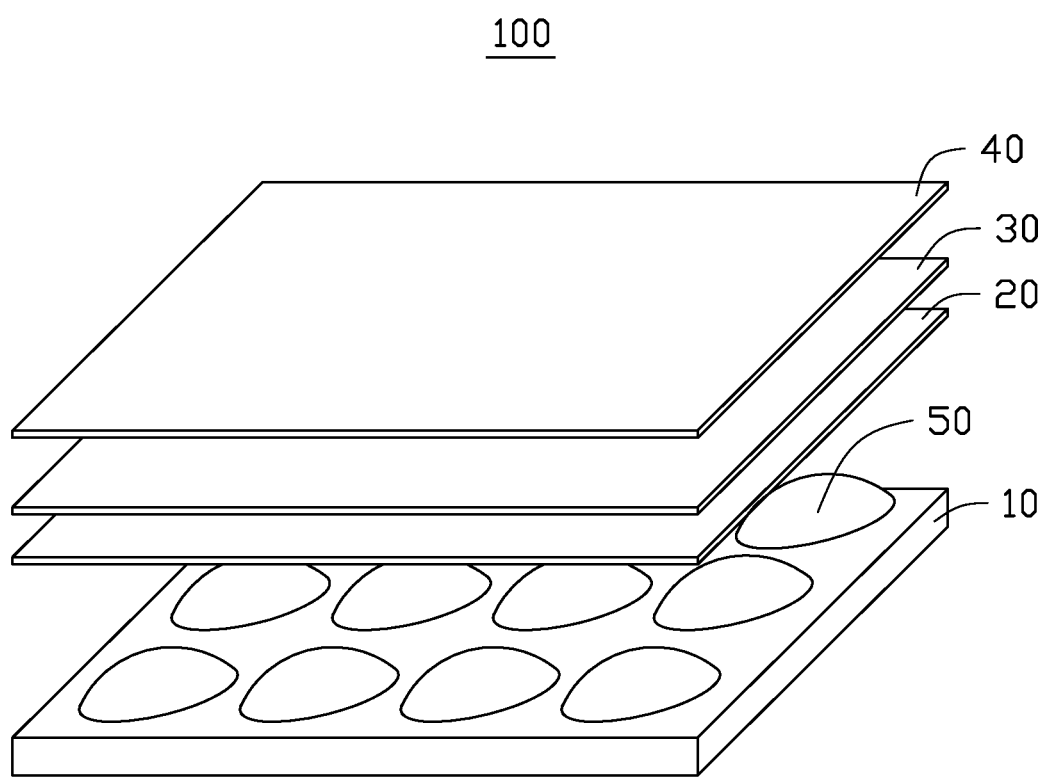
FIG. 2 is a perspective view of a light source device according to an embodiment of the disclosure.
Figure 3:
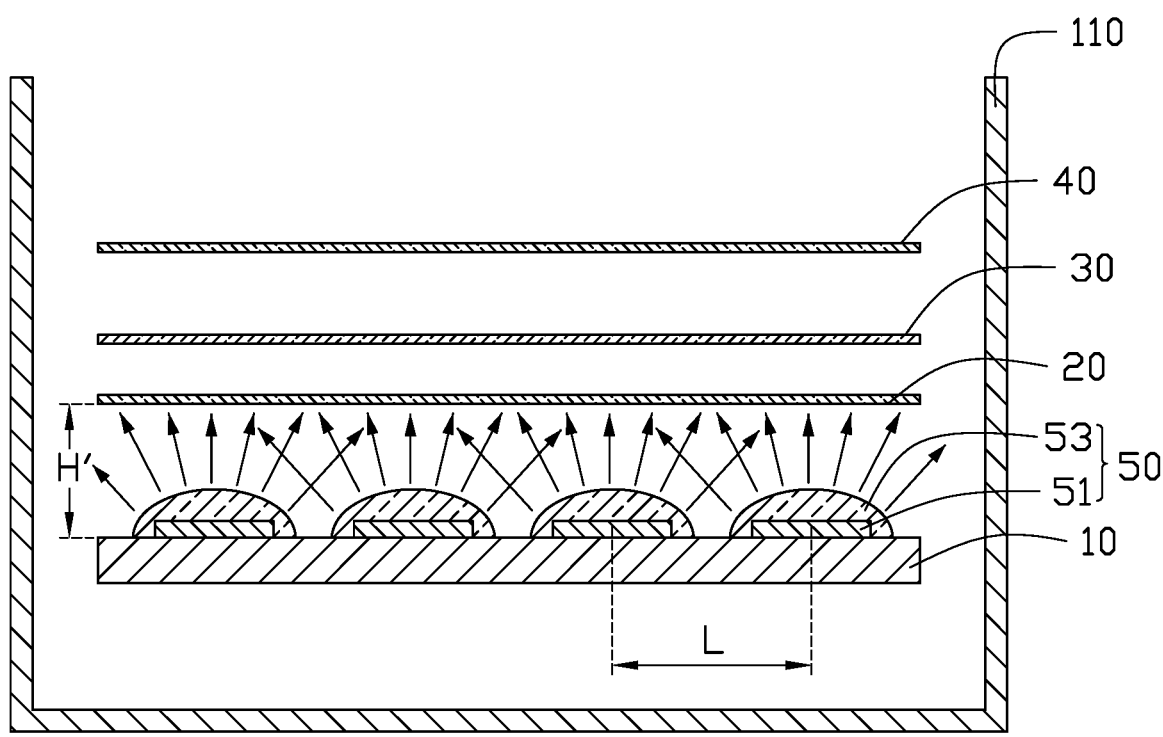
FIG. 3 is a sectional view of a light source device according to a first embodiment of the disclosure.

With reference to FIGS. 2 and 3, the light source device 100 of the first embodiment of this disclosure includes a substrate 10, a diffuser 20, a first brightness enhancement film 30 and a second brightness enhancement film 40, which are stacked in order.

A plurality of light-emitting units 50 are disposed on a surface of the substrate 10 facing the diffuser 20. The substrate 10 can be a common substrate such as a glass substrate or a plastic substrate (e.g. made of polyimide (PI)). The substrate 10 can also be a printed circuit board or a TFT substrate including a plurality of TFTs (thin-film transistors).

An external IC can be provided to connect the substrate 10 for controlling to turn on or turn off the light-emitting units 50 and adjusting the light illumination.

As shown in FIG. 3, the substrate 10 is disposed corresponding to the diffuser 20, and a distance is formed between the substrate 10 and the diffuser 20. This distance is defined as a light mixing distance H'. In addition, a distance is also existed between the light-emitting units 50 and the diffuser 20.

The diffuser 20 is a regular diffuser for diffusing the light emitted from the light-emitting units 50, thereby achieving a uniform outputted light.

The first brightness enhancement film 30 and the second brightness enhancement film 40 can be regular brightness enhancement films for collecting the light from the diffuser 20, so that the collected light can be mostly sent into the liquid crystal display panel 510. Accordingly, the configuration of the first brightness enhancement film 30 and the second brightness enhancement film 40 can increase the front light intensity of the liquid crystal display panel 510. According to the characteristics of the light wave (including the horizontal component wave and the vertical component wave), the cooperation of the first brightness enhancement film 30 and the second brightness enhancement film 40 can provide a good brightness enhancement effect.

As shown in FIG. 2, in this embodiment, the light-emitting units 50 of the substrate 10 are separately disposed, and an interval is defined between any two adjacent light-emitting units 50. In this embodiment, the light-emitting units 50 are arranged in an array and are disposed on the entire display area of the liquid crystal display panel 510. FIG. 2 experimentally shows a 4×3 array. In practice, the amount of the light-emitting units 50 can be far greater than a 4×3 array. The amount of the light-emitting units 50 can be can be adjusted based on the size of the panel, the size of the LED chip, and the product specification. In addition, the arrangement of the light-emitting units 50 can be in any other shape rather than the above-mentioned rectangular array.

In other embodiments, the distance between two adjacent light-emitting units 50 can be zero, and the two adjacent light-emitting units 50 are not overlapped.

Referring to FIG. 3, at least one light-emitting unit 50 includes a LED chip 51 and an optical material layer 53 corresponding to the LED chip 51. At least one LED chip 51 is disposed on the substrate 10, and the LED chips 51 of the light-emitting units 50 are separately disposed. In other words, an interval is provided between adjacent two of the LED chips 51, and the LED chips 51 are arranged in an array. FIG. 3 shows four light-emitting units 50. At least one LED chip 51 can be a common LED chip or a micro-LED chip. In some embodiments of this disclosure, the size of the micro-LED chip is less than or equal to several millimeters (e.g. several millimeters, hundred micrometers, or less than or equal to 100 micrometers). The optical material layer 53 is formed on the substrate 10 and totally covers the surface of the LED chip 51, so that the LED chip 51 is not exposed to air. The LED chip 51 is used to emit a light within a range of wavelength corresponding to a specific color (e.g. blue or green). The LED chips 51 of different light-emitting units 50 may emit the lights of the same color (e.g. both blue lights). Of course, The LED chips 51 of different light-emitting units 50 may emit the lights of different colors. For example, some of the LED chips 51 emit red light, some other LED chips 51 emit green light, and the residual LED chips 51 emit blue light. Accordingly, the LED chips 51 can provide different colors in different display areas. The optical material layer 53 is applied to adjust the lights emitted from the LED chips 51 so as to provide the lights with good optical properties to the diffuser 20. In this embodiment, the optical material layer 53 can increase the scattering angle of the light, thereby decreasing the minimum height for mixing the lights from two adjacent LED chips 51. In addition, the optical material layer 53 may include a fluorescent material or a quantum dot material for changing the wavelength (color) of the emitted light.

After the LED chips 51 is powered on, the LED chips 51 of all light-emitting units 50 emit the original lights with the same color (e.g. blue lights), and then the optical material layer 53 can convert the lights emitted from the LED chips 51 into another predetermined color (e.g. green light or red light). In addition, the original lights and the converted lights can be mixed to obtain another color light (e.g. white light). For example, if the LED chip 51 originally emits a blue light, the optical material layer 53 can be configured to make the light-emitting unit 50 to output a white light. In this case, the optical material layer 53 includes a YAG (yttrium aluminum garnet) fluorescent material, which can be excited by the blue light to output a yellow-green light. Then, the original blue light and the yellow-green light converted by the fluorescent material are combined to generate the white light. This method can be applied to obtain other color lights, and this disclosure is not limited to the above-mentioned YAG fluorescent material.

Figure 4A:
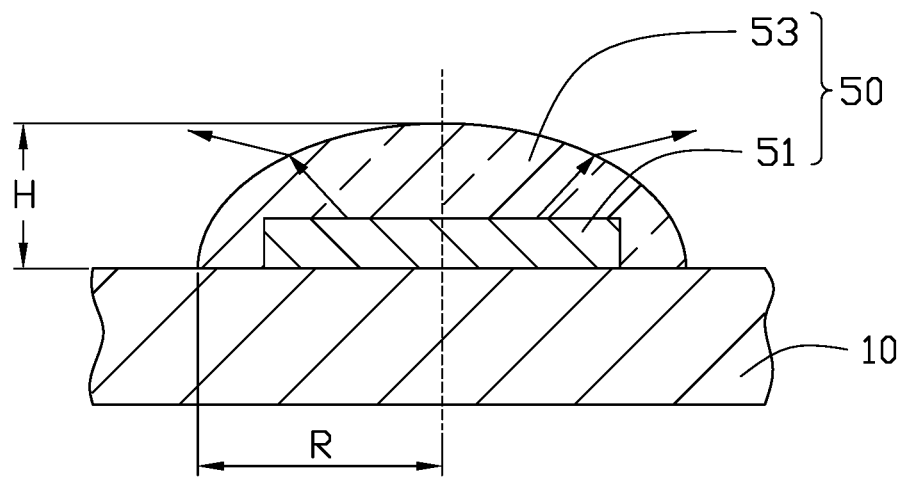
FIGS. 4a and 4b are section views of a light-emitting unit of the light source device of FIG. 3.
Figure 4B:
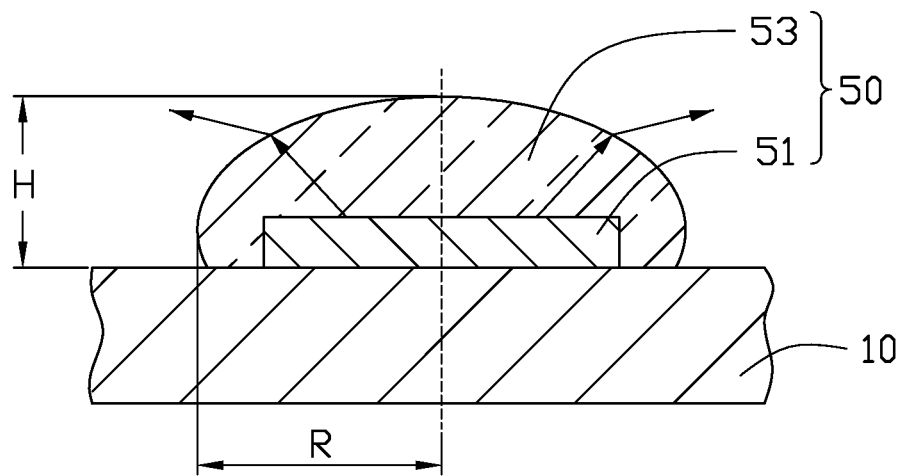

Referring to FIGS. 3, 4a and 4b, the shape of optical material layer 53 is substantially flat and slightly convex towards the diffuser 20. The optical material layer 53 has a convex profile protruding from the substrate 10. As shown in FIGS. 4a and 4b, a maximum width is defined as a distance between two farthest points on a pattern corresponding to a vertical projection of the optical material layer 53 on the surface of the substrate 10, and a half of the maximum width is defined as a first width R. In addition, a maximum height H is defined as a vertical distance from the surface of the substrate 10 to a highest point of the optical material layer 53 away from the substrate 10. In this embodiment, a ratio of R to H is between 5 and 1000. For example, the ratio of R to H is between 5 and 100, between 20 and 100, or between 20 and 50. In one example, the ratio of R to H is greater than 5 or greater than 20. In this embodiment, the pattern corresponding to a vertical projection of the optical material layer 53 on the surface of the substrate 10 is a circle, and the maximum width is equal to the diameter of the projected circle of the optical material layer 53 on the surface of the substrate 10.

In addition, R is less than or equal to a half (½) of a distance L between the center points of two adjacent LED chips 51, so that the optical material layer 53 of the two adjacent light-emitting units 50 are isolated with each other and are not overlapped. In other words, the optical material layer 53 of the two adjacent light-emitting units 50 are separately disposed.

As shown in FIG. 4a, the maximum width of the optical material layer 53 is located at the boundary of the optical material layer 53 and the substrate 10. As shown in FIG. 4b, the maximum width of the optical material layer 53 is located above the boundary of the optical material layer 53 and the substrate 10.

The optical material layer 53 can be formed on the LED chip 51 by any packaging method commonly used in this art. In this embodiment, the optical material layer 53 can be formed on the LED chip 51 by glue dispensing. In practice, the fluorescent material or the quantum dot material is mixed with a base material (e.g. a transparent epoxy) to form a mixture. Next, the mixture is disposed on the LED chip 51 by dispensing. Then, the mixture is dried and cured to form the optical material layer 53. In addition, to be understood, the viscosity, concentration parameter, dispensing speed of the mixture can be adjusted to control the ratio of R to H of the optical material layer 53 to be greater than 5:1.

Figure 5A:
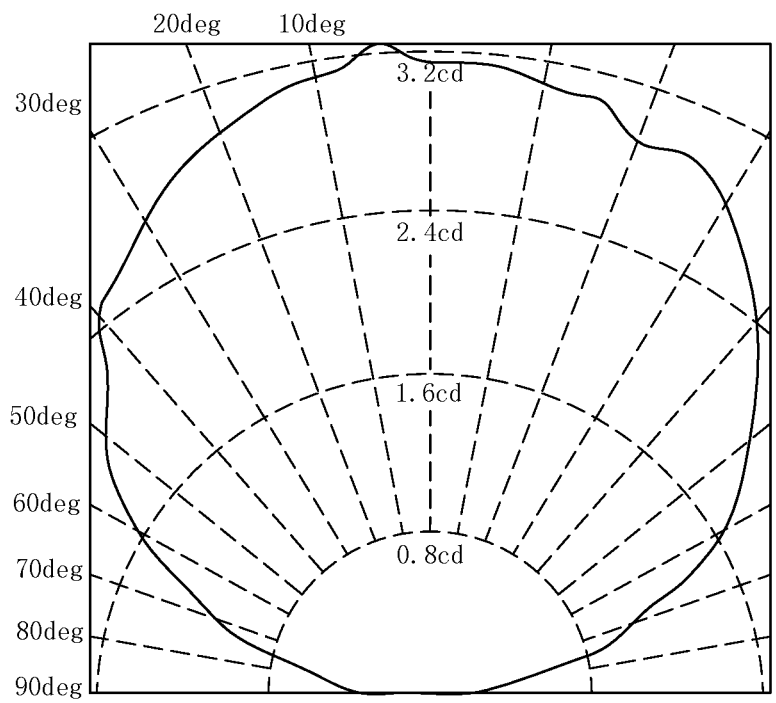
FIGS. 5a and 5b are schematic diagrams showing the light shape of the light emitted from the common light-emitting unit and the light shape of the light emitted from the light-emitting unit of the disclosure.
Figure 5B:
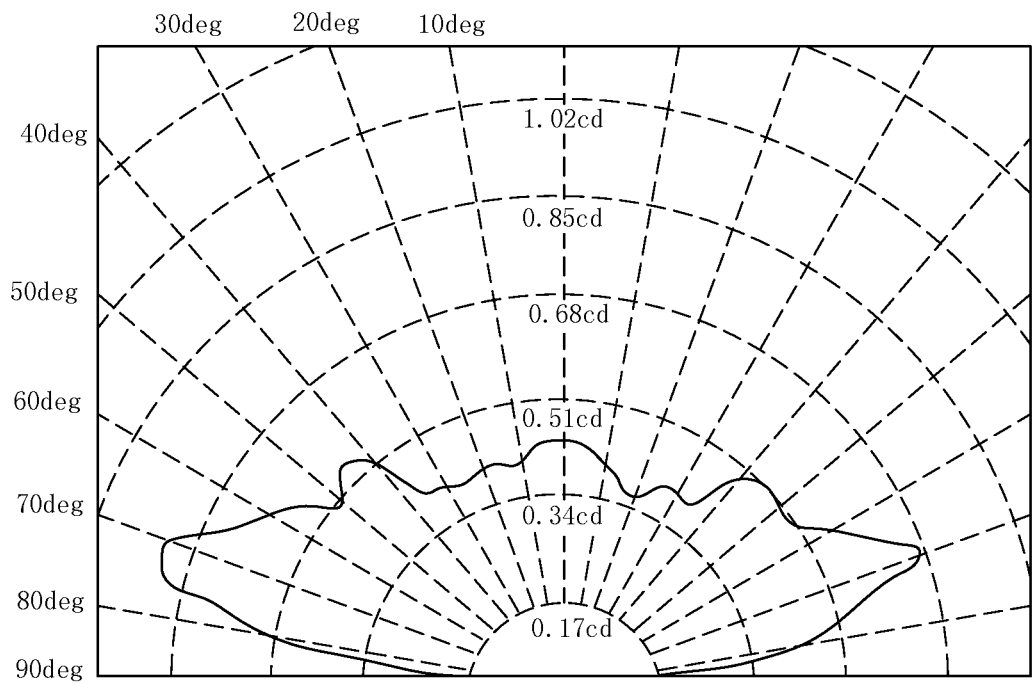

According to the experiments, it is found that the ratio of R to H can affect the light shape emitted from the light-emitting unit 50. FIG. 5a shows the light shape emitted from a LED die (a LED chip without the optical material layer), and FIG. 5b shows the light shape emitted from a LED chip (the same LED die covered by an optical material layer, and the ratio of R to H of the optical material layer is greater than 5). Compared with FIG. 5a, FIG. 5b shows a larger light scattering angle and a more uniform light intensity.

TABLE 1

| Parameter | LED die | LED chip covered by the optical material layer | | | |
|---|---|---|---|---|---|
| Optical material layer R | — | Greater than a half (½) of a distance between the center points of two adjacent LED chips | A | 5a-20a | >20a |
| H | — | a | A | a | a |
| R/H | — | — | 1 | Between 5 and 20 | >20 |
| Uniformity of outputted light (%) | 127% | 138% | 115% | 104% | 99% |

Table 1 shows the uniformities of the outputted lights emitted from a LED die (without an optical material layer) and LED chips with optical material layers having different shapes.

In these experiments, when R is designed to be greater than a half (½) of a distance L between the center points of two adjacent LED chips, the effect is equivalent to the case of applying a whole optical material layer 53 on the LED chips 51.

In the Table 1, the uniformity of the outputted light is defined as (maximum brightness value−minimum brightness value)/[(maximum brightness value+minimum brightness value)/2]×100%. When the value of the uniformity is smaller, the brightness uniformity is better.

As shown in Table 1, setting the ratio (R/H) to be greater than 20 can obtain a better brightness uniformity.

Accordingly, when the LED chip 51 emits light, the optical material layer 53 can convert the light into a predetermined color light and adjust the shape of light output, so that the lights emitted from the adjacent light-emitting units 50 can be well mixed. The light emitted from the light-emitting unit 50 is diffused by the diffuser 20 and then passes through the first brightness enhancement film 30 and the second brightness enhancement film 40 to enhance the brightness of the outputted light. Afterwards, the light is emitted into the liquid crystal display panel 510.

Second Embodiment

Similar to FIG. 1, a display device 500 of this embodiment includes a light source device 200 and a display panel 510 stacked on the light source device 200. The light source device 200 provides a light source to the display panel 510. In this embodiment, the display panel 510 is a liquid crystal panel, and the light source device 200 is a backlight module. Accordingly, the display device 500 is a liquid crystal display device.

Figure 6:
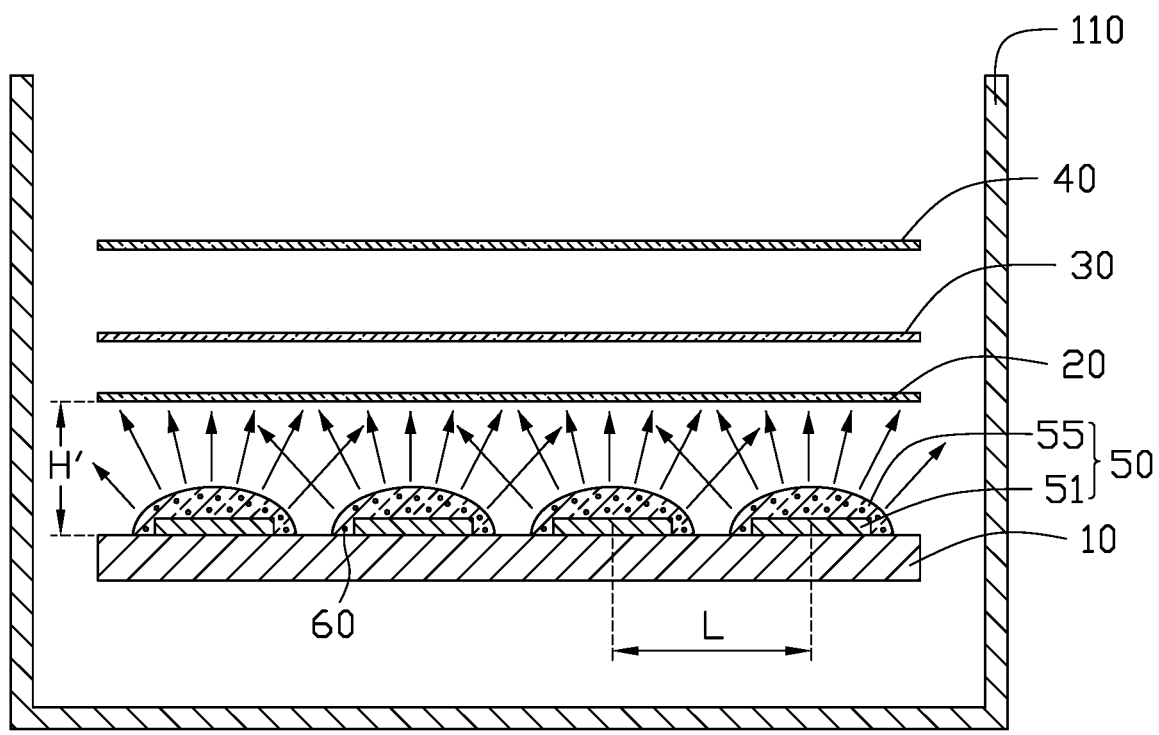
FIG. 6 is a sectional view of a light source device according to a second embodiment of the disclosure.

With reference to FIG. 6, the light source device 200 of the second embodiment of this disclosure includes a substrate 10, a diffuser 20, a first brightness enhancement film 30 and a second brightness enhancement film 40, which are stacked in order.

Figure 7A:
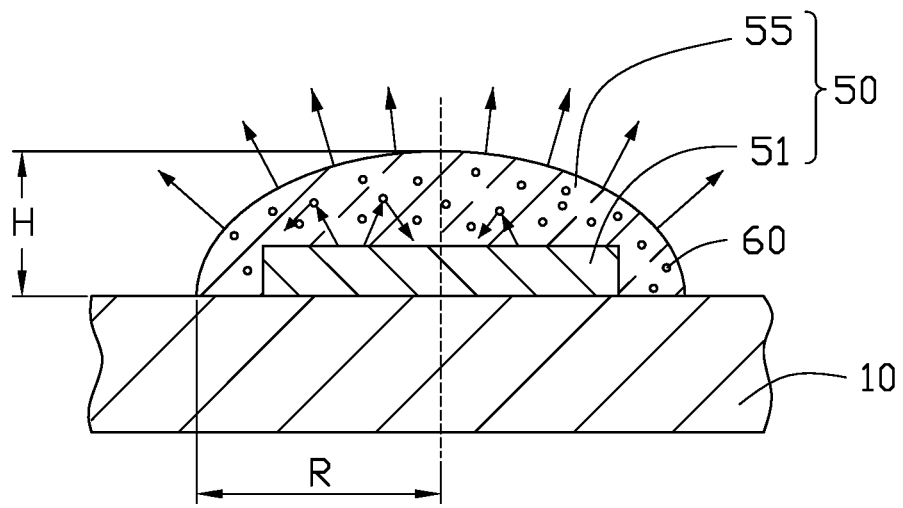
FIGS. 7a and 7b are section views of a light-emitting unit of the light source device of FIG. 6.
Figure 7B:
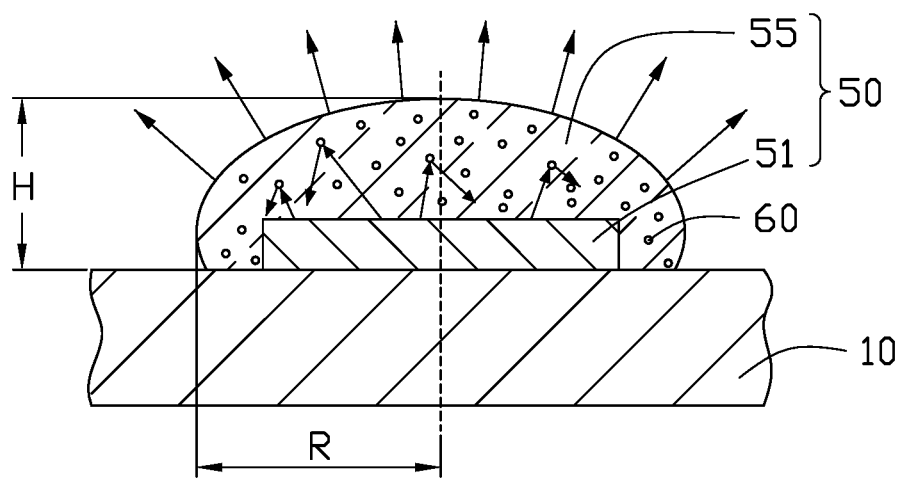

The substrate 10 of the second embodiment is the same as the substrate 10 of the first embodiment, and a plurality of light-emitting units 50 are disposed on the substrate 10. The same parts as those in embodiment 1 will not be described here. As shown in FIGS. 7a and 7b, similar to the light-emitting unit 50 of the first embodiment, at least one light-emitting unit 50 of the second embodiment includes a LED chip 51 and an optical material layer 55 corresponding to the LED chip 51. At least one light-emitting unit 50 of the second embodiment includes all features and requirements of the light-emitting unit 50 of the first embodiment, and the optical material layer 55 of the light-emitting unit 50 of the second embodiment further includes scatter particles 60. The scatter particles 60 can be any commonly used scatter particle in the art, such as titanium dioxide particles (with high refractive index). In this embodiment, the titanium dioxide particles (purity of 2N to 4N, particle size of 500 to 800 nanometers (sub-micron levels)) are used. The light emitted from the LED chip 51 can be scattered by the scatter particles 60 so as to change shape of the light output thereof, thereby achieving a uniform light mixing effect.

The optical material layer 55 can be formed on the LED chip 51 by any packaging method commonly used in this industry. In this embodiment, the optical material layer 55 can be formed on the LED chip 51 by glue dispensing. In practice, the fluorescent material or the quantum dot material, the scatter particles, and the base material (e.g. a transparent epoxy) are mixed to form a mixture. Next, the mixture is disposed on the LED chip 51 by dispensing. Then the mixture is dried and cured to form the optical material layer 55. In these processes, the viscosity, concentration parameter, dispensing speed of the mixture can be adjusted to control the ratio of R to H of the optical material layer 55 to be greater than 5:1.

To be understood, as shown in FIGS. 3 and 6, the light source device 100 or 200 can further include a frame 110, and the substrate 10, the diffuser 20, the first brightness enhancement film 30 and the second brightness enhancement film 40 are disposed inside the frame 110.

To be understood, the number and type of the brightness enhancement films is not limited by the embodiments of the disclosure, which includes two brightness enhancement films (the first brightness enhancement film 30 and the second brightness enhancement film 40), and the number and type of the brightness enhancement films can be optically arranged based on the regular arrangement of this art.

To be understood, the substrate 10 including the light-emitting units 50 of the first embodiment and the second embodiment can be individually used as a light source device.

Third Embodiment

Figure 8:
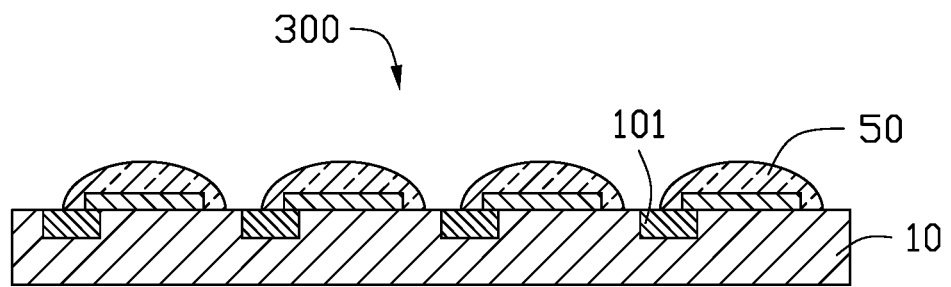
FIG. 8 is a sectional view of a substrate of a light source device according to a third embodiment of the disclosure.

FIG. 8 shows a light source device 300 according to a third embodiment of the disclosure. The light source device 300 includes a substrate 10 and a plurality of light-emitting units 50 disposed on a surface of the substrate 10. The structure and design of the light-emitting unit 50 is similar to those of the first embodiment. In this embodiment, the substrate 10 is a TFT substrate and includes a plurality of TFTs (thin-film transistors) 101. At least one light-emitting unit 50 is individually and electrically connected with one of the TFTs 101, so that the TFT 101 can control to turn on the corresponding light-emitting unit 50 and the brightness of the corresponding light-emitting unit 50. To be understood, At least one TFT 101 includes a gate (not shown), a semiconductor layer (not shown), a source (not shown) and a drain (not shown). FIG. 8 simply shows the electrical connection between the TFT 101 and the light-emitting unit 50.

Figure 9:
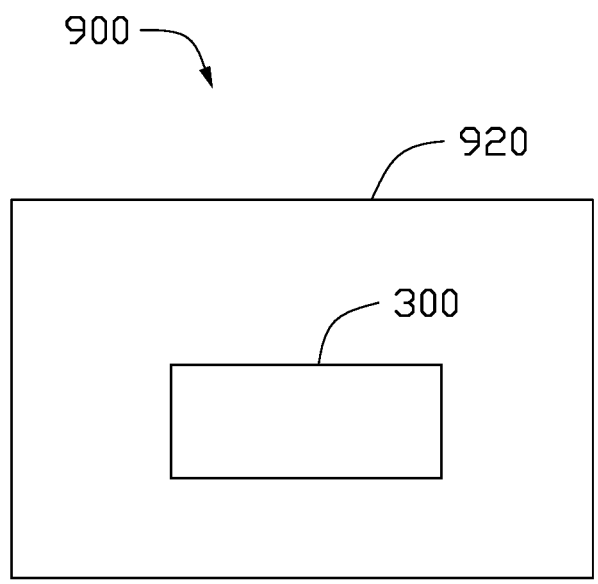
FIG. 9 is a schematic diagram of a display device according to a third embodiment of the disclosure.

FIG. 9 is a schematic diagram of a display device 900 according to a third embodiment of the disclosure. The display device 900 includes a self-emissive display panel 920, and the self-emissive display panel 920 includes the above-mentioned light source device 300. In this embodiment, the light source device 300 is not a backlight source but a part of a self-emissive display device. In more detailed, when the light-emitting units 50 of the light source device 300 are organic light-emitting diodes (OLED), the self-emissive display panel 920 is an OLED panel, and the display device 900 is an OLED display device. Alternately, when the light-emitting units 50 of the light source device 300 are micro light-emitting diodes (micro LEDs), the self-emissive display panel 920 is a micro LED panel, and the display device 900 is a micro LED display device.

In some embodiments of this disclosure, when the light mixing distance of the light source device is fixed, the shape of the optical material layer of the light source device can be adjusted to control the ratio of R to H to be between 5 and 1000, thereby modifying the shape of light output of the light emitted from the light-emitting units so as to obtain a more uniform outputted light from the light source device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A light source device, comprising:
   a substrate; and
   a plurality of light-emitting units disposed on a surface of the substrate, wherein each of the light-emitting units comprises a light source chip and an optical material layer covering the light source chip, a maximum width is defined as a distance between two farthest points on a pattern corresponding to a vertical projection of the optical material layer on the surface of the substrate, a half of the maximum width is defined as a first width R, a maximum height H is defined as a vertical distance from the surface of the substrate to a highest point of the optical material layer away from the substrate, and a ratio of R to H is between 20 and 1000.

2. The light source device according to claim 1, wherein the optical material layer has a convex profile protruding from the substrate.

3. The light source device according to claim 1, wherein the ratio of R to H is controlled between 20 and 1000 to modify a light shape of the light emitted from the light-emitting units so as to obtain a uniform outputted light from the light source device.

4. The light source device according to claim 1, wherein an interval is defined between adjacent two of the light source chips, and the first width R is less than or equal to a half of the interval.

5. The light source device according to claim 1, wherein the light source chip is a micro-LED chip.

6. The light source device according to claim 1, wherein the optical material layer comprises a fluorescent material or a quantum dot material.

7. The light source device according to claim 6, wherein the optical material layer comprises a scatter particle.

8. The light source device according to claim 1, wherein the substrate comprises a plurality of thin-film transistors, and at least one of the light-emitting units is electrically connected to one of the thin-film transistors.

9. A display device, comprising:
   a light source device comprising a substrate and a plurality of light-emitting units disposed on a surface of the substrate;
   wherein each of the light-emitting units comprises a light source chip and an optical material layer covering the light source chip, a maximum width is defined as a distance between two farthest points on a pattern corresponding to a vertical projection of the optical material layer on the surface of the substrate, a half of the maximum width is defined as a first width R, a maximum height H is defined as a vertical distance from the surface of the substrate to a highest point of the optical material layer away from the substrate, and a ratio of R to H is between 20 and 1000.

10. The display device according to claim 9, wherein the display device further comprises a display panel disposed on the light source device.

11. The display device according to claim 9, wherein the substrate comprises a plurality of thin-film transistors, and at least one of the light-emitting units is electrically connected to one of the thin-film transistors.

12. The display device according to claim 9, wherein the optical material layer has a convex profile protruding from the substrate.

13. The display device according to claim 9, wherein the ratio of R to H is controlled between 20 and 1000 to modify a light shape of the light emitted from the light-emitting units so as to obtain a uniform outputted light from the light source device.

14. The display device according to claim 9, wherein an interval is defined between adjacent two of the light source chips, and the first width R is less than or equal to a half of the interval.

15. The display device according to claim 9, wherein the light source chip is a micro-LED chip.

16. The display device according to claim 9, wherein the optical material layer comprises a fluorescent material or a quantum dot material.

17. The display device according to claim 9, wherein the optical material layer comprises a scatter particle.

18. A self-emissive display panel, comprising:
   a substrate; and
   a plurality of light-emitting units disposed on a surface of the substrate, wherein each of the light-emitting units comprises a light source chip and an optical material layer covering the light source chip, a maximum width is defined as a distance between two farthest points on a pattern corresponding to a vertical projection of the optical material layer on the surface of the substrate, a half of the maximum width is defined as a first width R, a maximum height H is defined as a vertical distance from the surface of the substrate to a highest point of the optical material layer away from the substrate, and a ratio of R to H is between 20 and 1000.

19. The self-emissive display panel according to claim 18, wherein the optical material layer has a convex profile protruding from the substrate.

20. The self-emissive display panel according to claim 18, wherein an interval is defined between adjacent two of the light source chips, and the first width R is less than or equal to a half of the interval.

* * * * *